US007659711B2

(12) United States Patent
Song et al.

(10) Patent No.: US 7,659,711 B2
(45) Date of Patent: Feb. 9, 2010

(54) TEST HANDLER INCLUDING SINGLE-DOOR-TYPE STOCKERS

(75) Inventors: Yeon-gyu Song, Cheonan-si (KR);
Ho-gyung Kim, Cheonan-si (KR);
Kyong-eob Eom, Cheonan-si (KR);
Seung-hee Lee, Cheonan-si (KR);
Jae-ho Song, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 492 days.

(21) Appl. No.: 11/723,491

(22) Filed: Mar. 20, 2007

(65) Prior Publication Data
US 2007/0221548 A1   Sep. 27, 2007

(30) Foreign Application Priority Data
Mar. 22, 2006   (KR) .................. 10-2006-0026045

(51) Int. Cl.
    G01R 31/02   (2006.01)
    G01R 31/28   (2006.01)
(52) U.S. Cl. ................. 324/158.1; 324/765; 365/201
(58) Field of Classification Search ............. 324/158.1, 324/760, 765; 209/573; 414/331.01–331.18, 414/751.1, 752.1, 935–941; 365/201
    See application file for complete search history.

(56) References Cited

U.S. PATENT DOCUMENTS 6,102,162 A * 8/2000 Teicher ................. 186/39

6,346,682 B2   2/2002 Kim et al.
6,844,717 B2 * 1/2005 Shim et al. ............... 324/158.1
7,348,768 B2 * 3/2008 Lee ......................... 324/158.1

FOREIGN PATENT DOCUMENTS

JP   09-089982     4/1997
KR   1999-0013599  2/1999

OTHER PUBLICATIONS

Korean Patent Office "Notice of Office Action" dated Mar. 29, 2007, for corresponding Korean Patent Application No. 10-2006-0026045.

* cited by examiner

*Primary Examiner*—Ernest F Karlsen
(74) *Attorney, Agent, or Firm*—Harness, Dickey & Pierce, P.L.C.

(57) ABSTRACT

A handler may include a handler system main body used for testing semiconductor devices; an open-type stocker portion on a front side of the handler system main body; and/or a plurality of single-door-type stockers in the open-type stocker portion. The single-door-type stockers may include windows on upper parts of front sides of the single-door-type stockers. The front sides of the single-door-type stockers may be protected. The handler also may include a front top door on an upper part of the front side of the handler system main body; locking stoppers below the windows of the single-door-type stockers; safety sensors on sides of the open-type stocker portion; and/or a working table in front of the open-type stocker portion. The open-type stocker portion may be below the front top door. The safety sensors may stop the handler when the single-door-type stockers are not closed.

23 Claims, 8 Drawing Sheets

TEST HANDLER INCLUDING SINGLE-DOOR-TYPE STOCKERS

PRIORITY STATEMENT

This application claims priority from Korean Patent Application No. 10-2006-0026045, filed on Mar. 22, 2006, in the Korean Intellectual Property Office (KIPO), the entire contents of which are incorporated herein by reference.

BACKGROUND

1. Field

Example embodiments relate to equipment for electrically testing semiconductor devices. Also, example embodiments relate to handlers, which are automatic test robots, that perform loading, grouping, and unloading operations on one or more devices under test (DUTs).

2. Description of Related Art

Surface mount devices (SMDs), such as, small outline package (SOP), quad flat package (QFP), ball grid array (BGA), and chip size package (CSP) semiconductor packages, have a problem in that their leads or solder balls are easily damaged even with small external impacts after the SMDs are completely assembled. To prevent this problem, SMDs use protector-carriers that are called trays.

When semiconductor devices are electrically tested, a handler, which is an automatic testing robot, is physically and electrically connected to a tester. The handler loads the semiconductor devices thereinto, electrically connects the semiconductor devices to the tester to perform electrical testing operations on the semiconductor devices, and classifies the semiconductor devices according to results of the electrical tests. To convey the semiconductor devices, the handler uses trays as carriers. A plurality of semiconductor devices are horizontally loaded on the trays having matrix type pockets. The trays are roughly classified into user trays, used to convey and hold the semiconductor devices, and test trays, used to connect the semiconductor devices to a tester within the handler. The test trays are used as intermediate media to connect the semiconductor devices to a tester while the semiconductor devices are in the handler.

Figure 1:
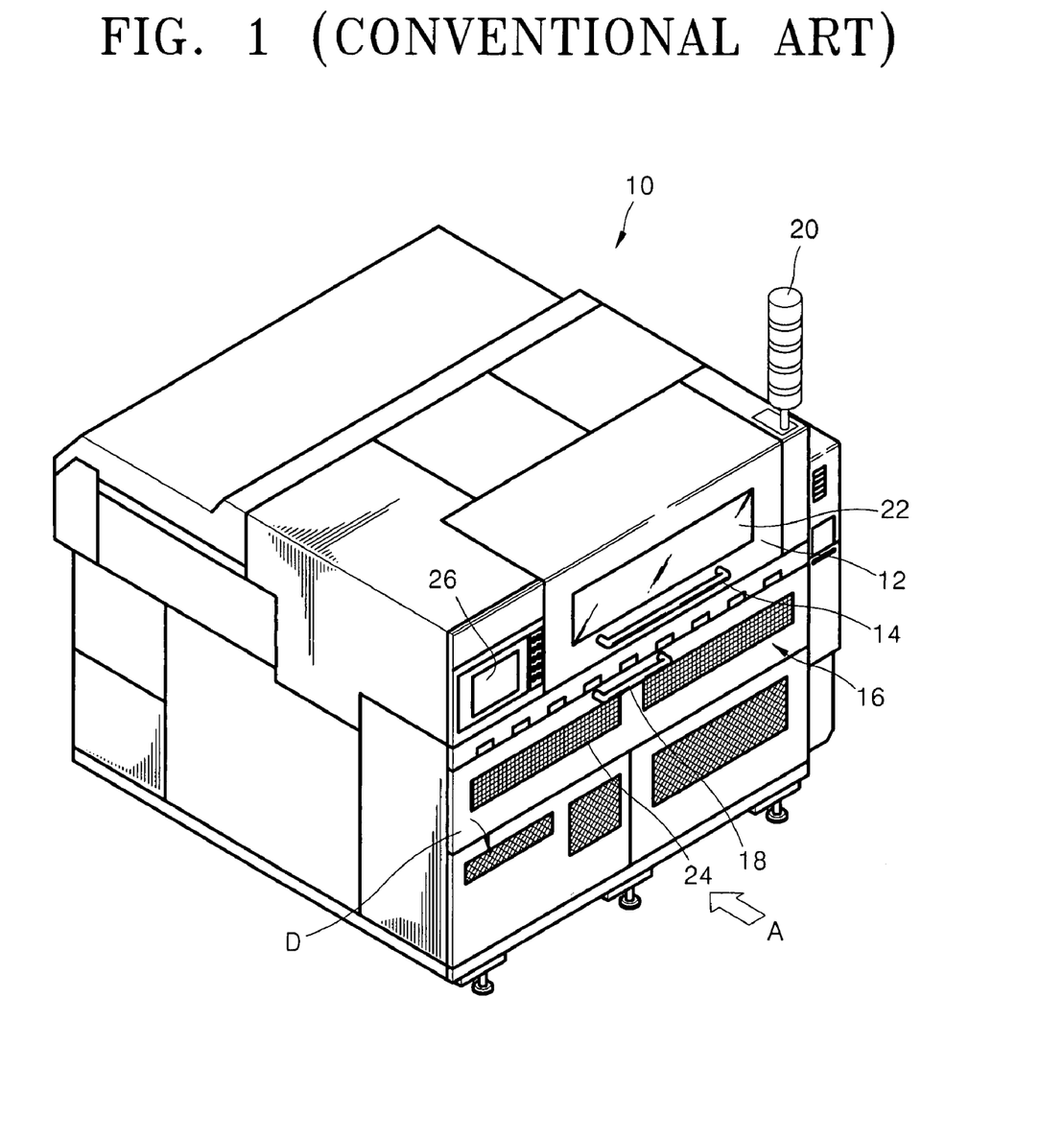
FIG. 1 is a perspective view of a conventional handler for testing semiconductor devices.
Figure 2:
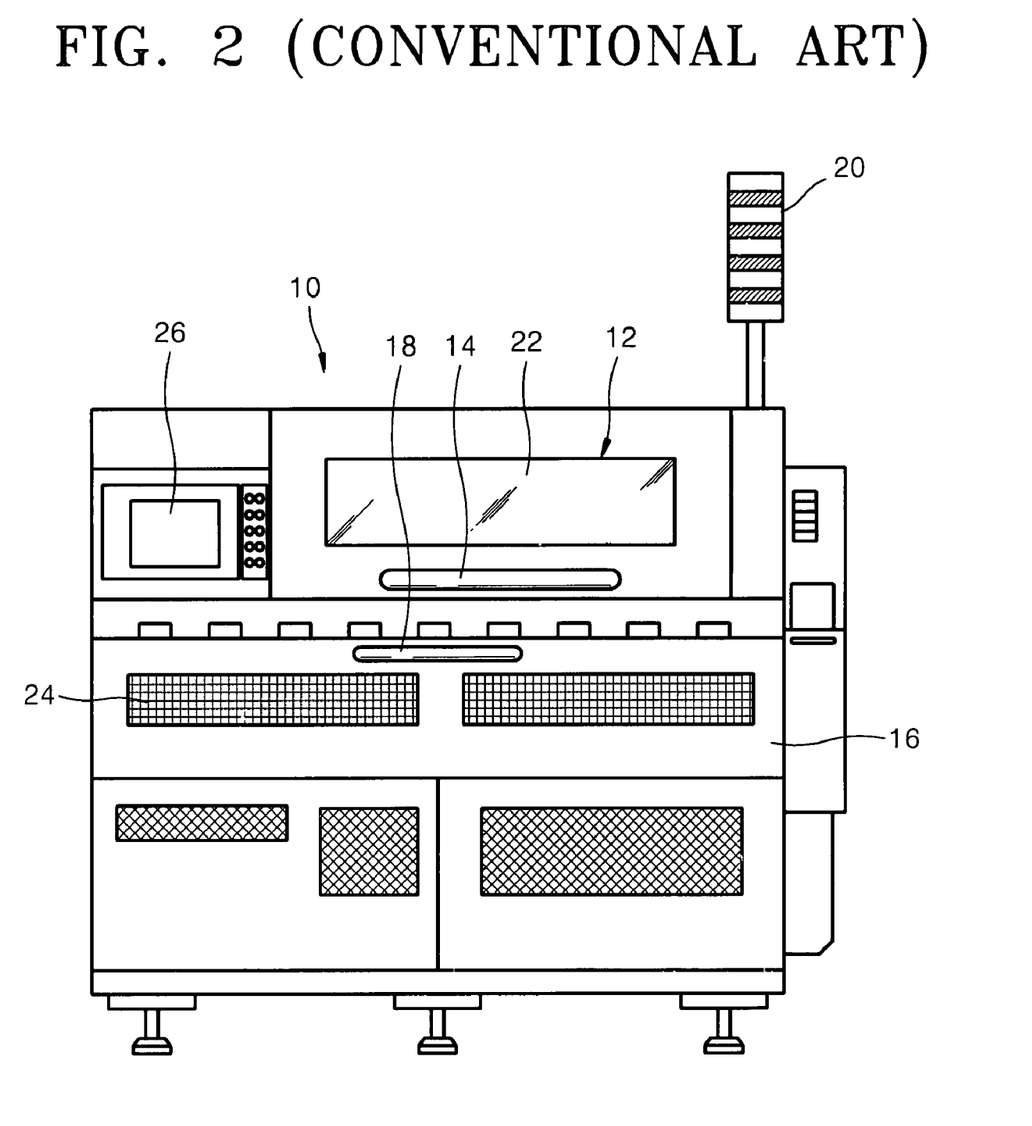
FIG. 2 is a front view of the conventional handler of FIG. 1, viewed from the direction A.

FIG. 1 is a perspective view of a conventional handler 10 for testing semiconductor devices. FIG. 2 is a front view of the conventional handler 10 of FIG. 1, viewed from the direction A.

Referring to FIGS. 1 and 2, the conventional handler 10 has a front top door 12 on the top part of the front side. The front top door 12 has a transparent or substantially transparent window 22 through which the inside of the conventional handler 10 can be checked with human eyes. A first handle 14 is on the front top door 12. When a problem occurs within the conventional handler 10, an operator opens the front top door 12 by means of the first handle 14 in order to check the inside of the conventional handler 10. A control panel 26 used to control the conventional handler 10 is on the left side of the front top door 12. The operator controls the operation of the conventional handler 10 by using the control panel 26. An alarm lamp 20 is on the front top door 12 so that the operator can easily detect problems occurring within the conventional handler 10.

A stocker portion is under the front top door 12 and covered by a batch-type stocker cover 16. A gauze window 24 is on the batch-type stocker cover 16 and is made of metal. The stocker portion serves as a passage through which semiconductor devices enter to be electrically tested and/or semiconductor devices that have completed the electrical tests come out. The input and output of the semiconductor devices are performed with the batch-type stocker cover 16 opened by pulling a second handle 18 forward as indicated by thinner arrow D.

Figure 3:
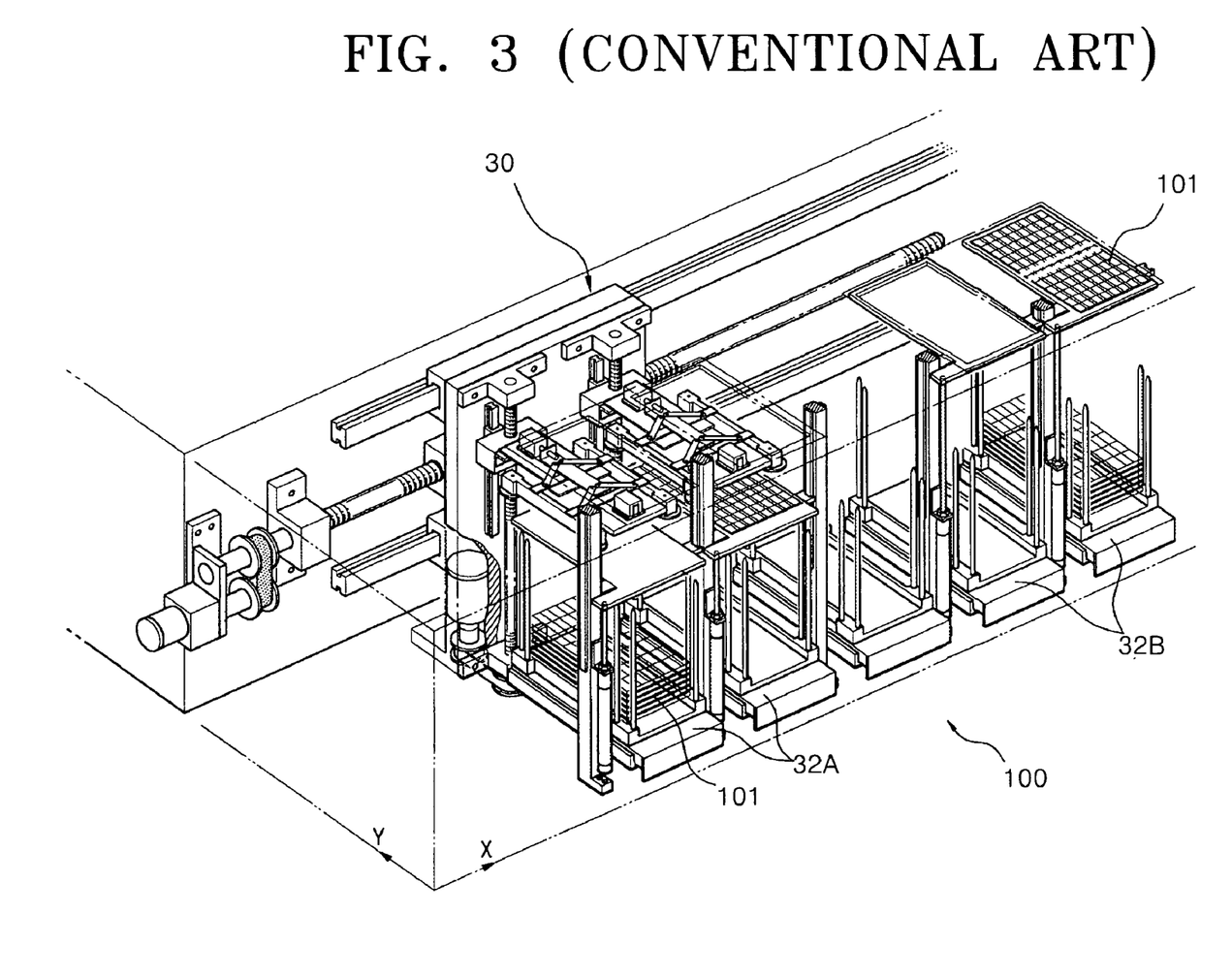
FIG. 3 is a perspective view of a plurality of stockers that are included in a stocker portion of FIG. 1.

FIG. 3 is a perspective view of a plurality of stockers 32 that are included in the stocker portion of FIG. 1. Referring to FIG. 3, the stockers 32 are classified into stockers 32A, used when semiconductor devices seated on user trays 101 are put in to perform electrical tests, and stockers 32B, used to classify test-completed semiconductor devices according to the test results and to arrange them accordingly. The user trays 101 are conveyed by a tray conveyance robot 30 that repeats X-axis and Y-axis movements over the stockers 32A and 32B.

Technology relevant to the conventional handler 10 used to electrically test semiconductor devices has been published in U.S. Pat. No. 6,346,682, entitled "Rambus Handler," patented on Feb. 12, 2002, the entire contents of which are incorporated herein by reference.

However, the conventional handler 10 needs to be improved in a number of respects. It is very burdensome to open the heavy steel batch-type stocker cover 16 using the second handle 18 in order to put semiconductor devices to be electrically tested into the conventional handler 10 or to take semiconductor devices having completed electrical tests out of the conventional handler 10. In general, a single operator performs an electrical test on semiconductor devices while managing at least ten handlers. Hence, the burdensome opening and closing of the heavy batch-type stocker cover 16 for injection and ejection of semiconductor devices degrades the efficiency of production.

Also, the batch-type stocker cover 16 is easily and frequently out of order because of a structural problem of the batch-type stocker cover 16. In a process of frequently opening and closing the batch-type stocker cover 16 made of steel, the handle of the batch-type stocker cover 16 frequently breaks. This increases the time required for maintenance, consequently degrading the operation rate of the conventional handler 10 and degrading the productivity of handlers. When the batch-type stocker cover 16 is more severely broken and separated from the conventional handler 10 onto the floor, there is a safety concern that an operator may get hurt.

Furthermore, the gauze window 24 of the batch-type stocker cover 16 prevents an operator from easily checking the condition of the inside of the stocker portion, so the batch-type stocker cover 16 needs to be frequently opened. Since the tray conveyance robot 30 moves within the stocker portion, when an operator puts his or her hand into the stocker portion, there is a safety concern that the operator may get hurt.

SUMMARY

Example embodiments may provide a handler including single-door-type stockers instead of a batch-type stocker cover so that productivity may be improved and the risk of accidents involving operators may be reduced.

According to an example embodiment, a handler may include a handler system main body used for testing semiconductor devices; an open-type stocker portion on a front side of the handler system main body; and/or a plurality of single-door-type stockers in the open-type stocker portion. The single-door-type stockers may include windows on upper parts of front sides of the single-door-type stockers. The front sides of the single-door-type stockers may be protected.

In an example embodiment, the handler system main body may be a parallel-type handler that may be used for electrically testing memory devices.

In an example embodiment, the open-type stocker portion may include a working table that may protrude outwardly from the open-type stocker portion. The working table may be detachable and/or may protrude outwardly greater than or equal to about 30 cm and less than or equal to about 50 cm.

In an example embodiment, the open-type stocker portion may further include one or more safety sensors. The one or more safety sensors may stop the handler when the single-door-type stockers are not closed. At least one of the one or more safety sensors may be, for example, an optical sensor. The open-type stocker portion may include a safety sensor on a side of the open-type stocker portion. The safety sensor may be, for example, an optical sensor. A mirror or similar device that may work with the safety sensor may be, for example, on an opposite side of the open-type stocker portion. The open-type stocker portion may include safety sensors on both sides of the open-type stocker portion. The safety sensors may be, for example, optical sensors.

In an example embodiment, the windows may be made of transparent or substantially transparent material so that the insides of the single-door-type stockers may be checked with the naked eye. The transparent or substantially transparent material may be, for example, polycarbonate, acrylic resin, polycarbonate and acrylic resin, and/or similar material(s).

In an example embodiment, the single-door-type stockers may further include locking stoppers below the windows in order to prevent occurrence of a safety accident in which the fingers of an operator are injured.

According to example embodiments, a handler for electrically testing semiconductor devices includes single-door-type stockers on which transparent or substantially transparent windows may be provided. Accordingly, frequent opening and closing operations of a heavy stocker cover may not be required, and thus the working efficiency may be improved. Due to the use of locking stoppers and safety sensor(s), the safety of an operator may be improved.

BRIEF DESCRIPTION OF THE DRAWINGS

The above and/or other aspects and advantages will become more apparent and more readily appreciated from the following detailed description of example embodiments taken in conjunction with the accompanying drawings, in which.

DETAILED DESCRIPTION OF EXAMPLE EMBODIMENTS

Example embodiments will now be described more fully with reference to the accompanying drawings. Embodiments, however, may be embodied in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to," or "coupled to" another component, it may be directly on, connected to, or coupled to the other component or intervening components may be present. In contrast, when a component is referred to as being "directly on," "directly connected to," or "directly coupled to" another component, there are no intervening components present. As used herein, the term "and/or" includes any and all combinations of one or more of the associated listed items.

It will be understood that, although the terms first, second, third, etc., may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the example embodiments.

Spatially relative terms, such as "beneath," "below," "lower," "above," "upper," and the like may be used herein for ease of description to describe one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, that may be illustrated in the accompanying drawings, wherein like reference numerals may refer to the like components throughout.

Figure 4:
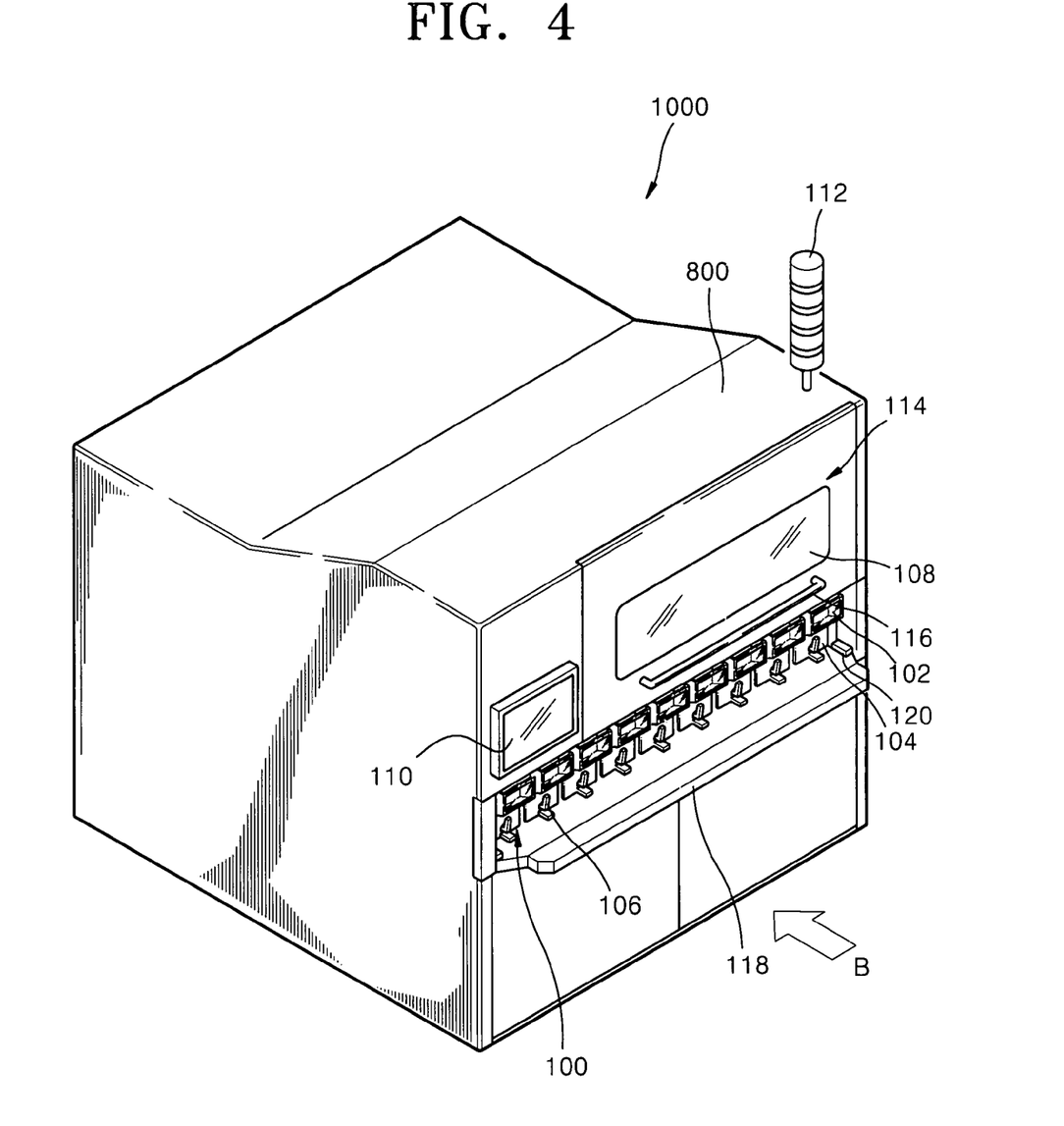
FIG. 4 is a perspective view of a handler for testing semiconductor devices according to an example embodiment.
Figure 5:
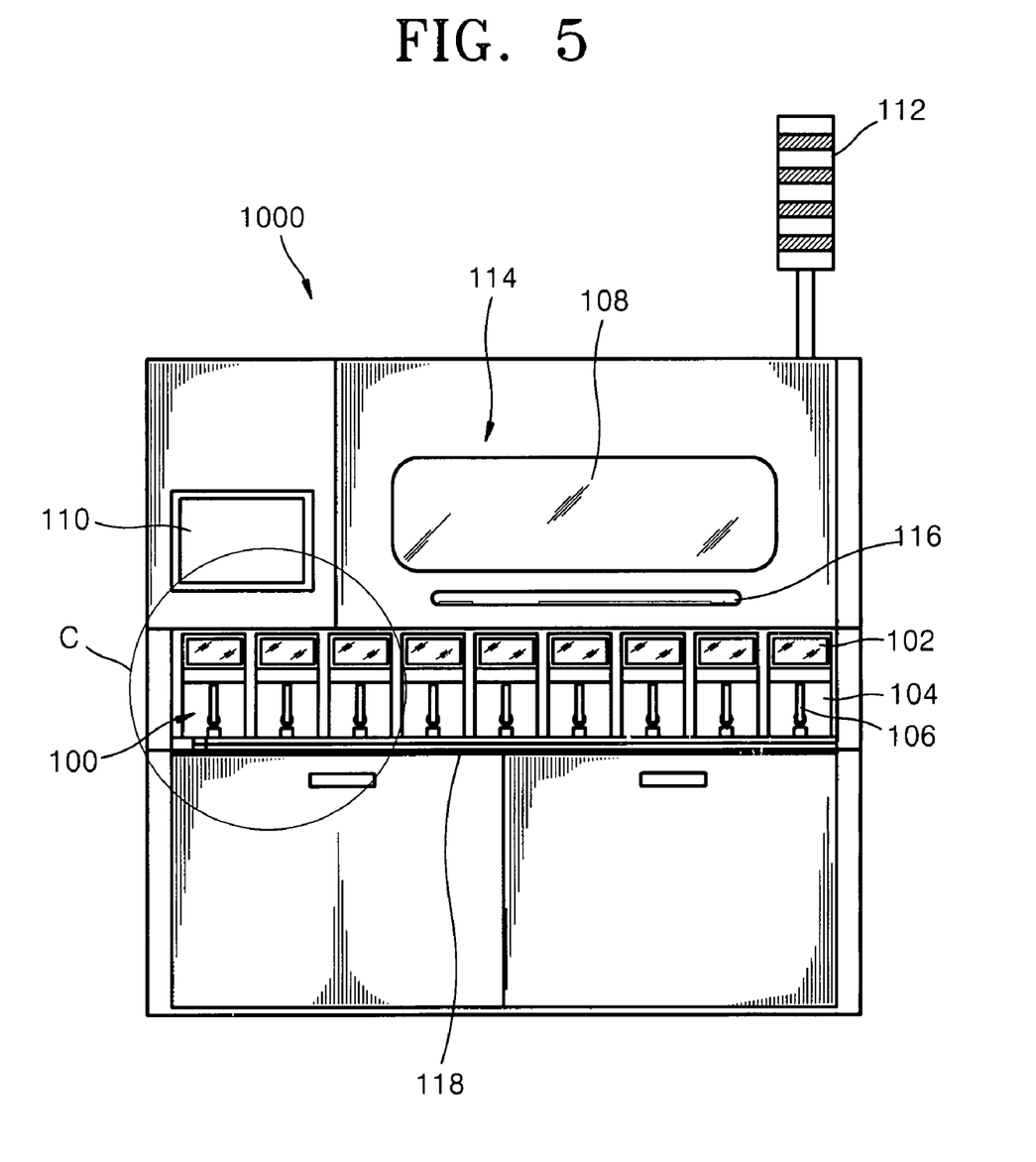
FIG. 5 is a front view of the handler of FIG. 4, viewed from the direction B.
Figure 6:
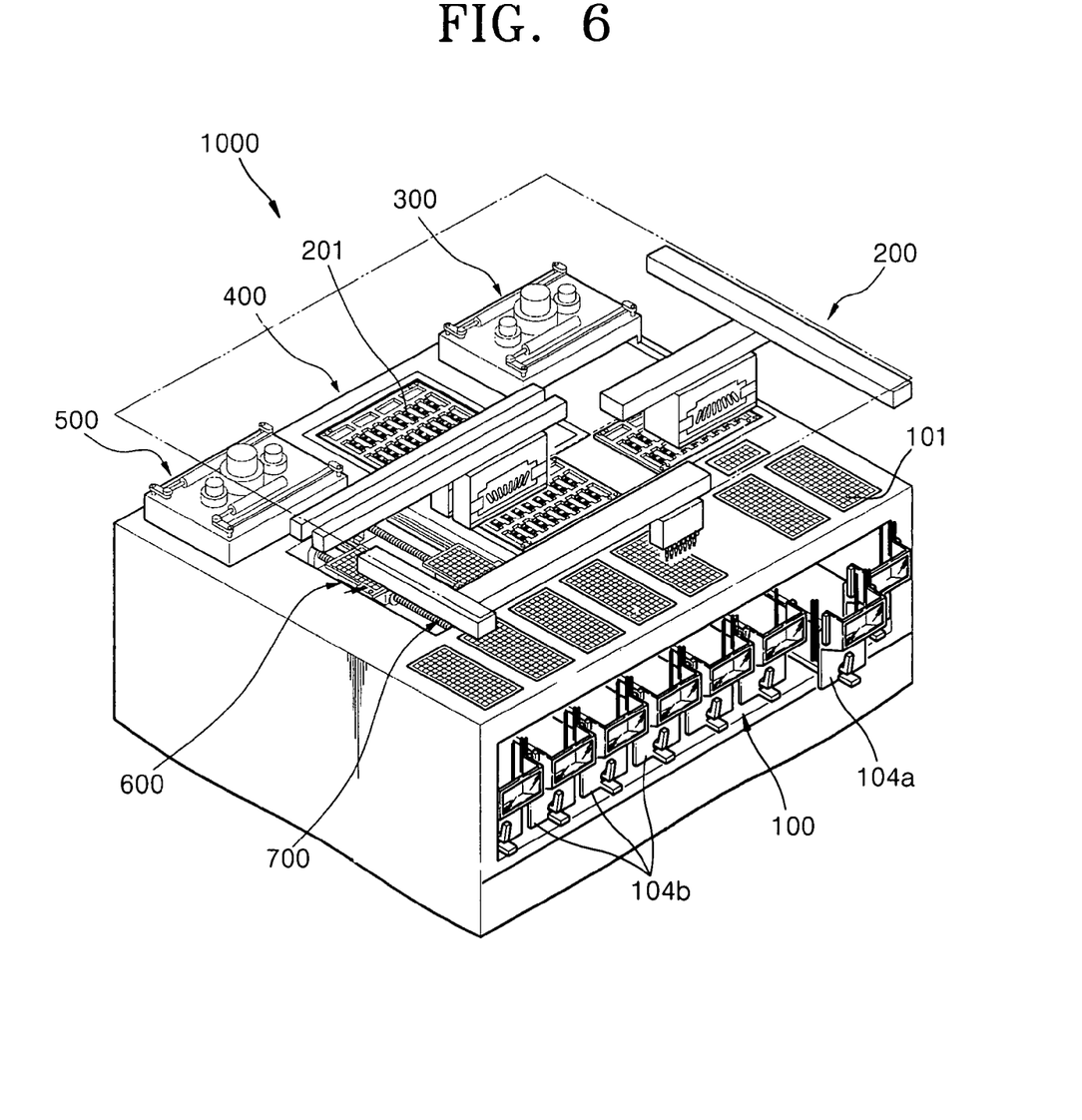
FIG. 6 is a perspective view illustrating an example operation of the handler of FIG. 4.

FIG. 4 is a perspective view of a handler 1000 for testing semiconductor devices according to an example embodiment. FIG. 5 is a front view of the handler 1000 of FIG. 4, viewed from the direction B. FIG. 6 is a perspective view illustrating an example operation of the handler 1000 of FIG. 4.

Referring to FIGS. 4 through 7, the handler 1000 may include a handler system main body 800, an open-type stocker portion 100 in the front side of the handler system main body 800, and/or a plurality of single-door-type stockers 104 that may be in the open-type stocker portion 100. The front sides of the single-door-type stockers 104 may be at least partially protected, for example, by one or more covers, by being recessed in the stocker portion 100, by a working table 118 (described below), and/or in other ways. Windows 102 may be, for example, on the upper parts of the front sides of the single-door-type stockers 104.

In contrast with a conventional handler, the handler 1000 may not include a batch-type stocker cover. Instead, the front sides of the individual stockers 104 may serve as the batch-type stocker cover. Accordingly, the front side of the open-type stocker portion 100 may be open without separate covers. Conventional individual stockers designed to stack user trays thereon may be replaced by the individual single-door-type stockers 104 whose front sides may be protected from an operator's intrusions.

The windows 102 on the front sides of the single-door-type stockers 104 may be made, for example, of transparent or substantially transparent material so that the states of the stockers 104 may be checked with the operator's eyes. Hence, operators may easily check the open-type stocker portion 100 without opening a stocker cover as in the conventional art, and also easily check the insides of the single-door-type stockers 104 through the windows 102.

A front top door 114 may be on the front side of the handler system main body 800, and/or a transparent or substantially transparent window 108 may be in the front top door 114. Hence, operators may check the transferring and/or testing statuses of devices under test (DUTs) through the transparent or substantially transparent window 108. In some cases, operators may open the front top door 114 using a handle 116 of the front top door 114 in order to solve a problem generated inside the front top door 114. A control panel 110 that may be needed to control the entire operation of the handler 1000 may be, for example, on the left side of the front top door 114. The location of the control panel 110 may be changed as needed.

An alarm lamp 112 may be on the top side of the handler system main body 800 so that when an error is generated within the handler 1000 while the handler 1000 is operating, an operator may be easily made aware that an error has occurred.

The single-door-type stockers 104 in the open-type stocker portion 100 may include locking stoppers 106.

The open-type stocker portion 100 may include one or more safety sensors 120. The one or more safety sensors 120 may stop the handler 1000 when the single-door-type stockers 104 are not closed. At least one of the one or more safety sensors 120 may be, for example, an optical sensor. The open-type stocker portion 100 may include a safety sensor 120 on a side of the open-type stocker portion 100. The safety sensor 120 may be, for example, an optical sensor. A mirror or similar device that may work with the safety sensor 120 may be, for example, on an opposite side of the open-type stocker portion 100. The open-type stocker portion 100 may include safety sensors 120 on both sides of the open-type stocker portion 100. The safety sensors 120 may be, for example, optical sensors.

The working table 118 may be used when semiconductor devices seated on user trays 101 are put into and/or removed from the handler 1000. The working table 118 may be in front of the open-type stocker portion 100. The working table 118 may protrude outwardly from the open-type stocker portion 100, for example, greater than or equal to about 30 cm and less than or equal to about 50 cm. Hence, the size of the working table 118 may be large enough for an operator to conveniently stack user trays 101 on which semiconductor devices may be seated. The working table 118 may be detachable so as not to be damaged and/or destroyed due to its protruding shape when the handler 1000 is moved.

The handler 1000 may be a parallel-type handler for electrically testing, for example, 64 or 256 memory semiconductor devices at a time.

Referring to FIG. 6, in an operation of the handler 1000, an operator may open a single-door-type stocker 104a outward from the open-type stocker portion 100, may put a user tray 101 on which a DUT is seated on the opened stocker 104a, and/or may inject the DUT into the handler 1000. Thereafter, the handler 1000 may transfer the injected user tray 101 from a device loading unit 200 to a test tray 201. The test tray 201 may be used to electrically connect a plurality of semiconductor devices directly to a tester. The DUT seated on the test tray 201 may be transferred to a preheating chamber 300 and/or aged for a predetermined period of time at high temperature (i.e., greater than or equal to about 70° C. and/or less than or equal to about 128° C.) or at low temperature (i.e., greater than or equal to about −40° C. and/or less than or equal to about 0° C.).

The DUT seated on the test tray 201 and/or preheated by the preheating chamber 300 may then be transferred to a test chamber 400 and electrically connected to automatic test equipment (ATE), and/or may undergo electrical testing. When the electrical testing is completed, the DUT seated on the test tray 201 may be transferred to a recovery chamber 500 and/or aged at a normal temperature.

Then, a device classifying unit 600 of the handler 1000 may classify the DUT seated on the test tray 201 into a pass group or a reject group according to the result of the electrical testing by transferring the DUT seated on the test tray 201 to a user tray 101. The classified DUT may be transferred to a single-door-type stocker 104b by a tray transfer robot (not shown) included in the handler 1000. The single-door-type stocker 104b may be used to eject a test-completed DUT from the handler 1000.

Hence, the open-type stocker portion 100 may correspond to a passage through which a DUT is put into and/or removed from the handler 1000. In an example embodiment, the single-door-type stockers 104 may be used instead of a separate cover, and the working table 118 protruding outwardly may be so that electrical testing may be performed without burdensome operations.

Figure 7:
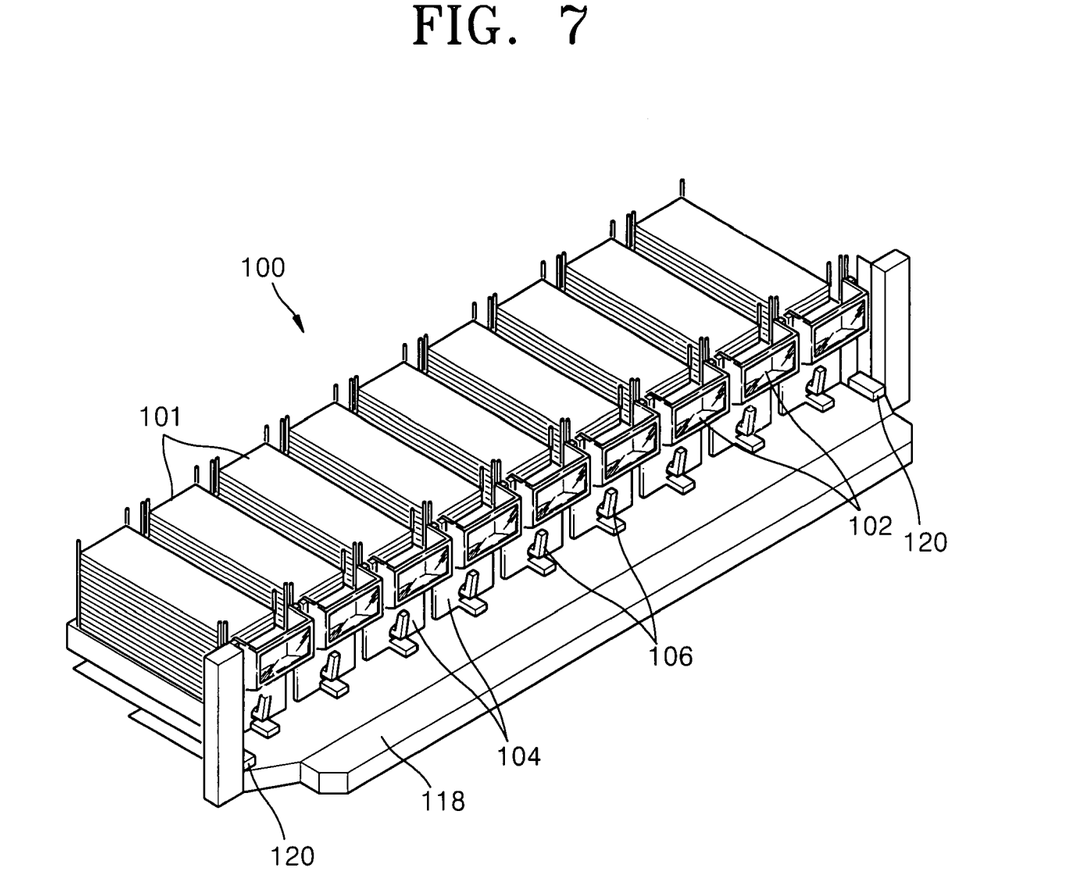
FIG. 7 is a perspective view illustrating example shapes of single-door-type stockers in a open-type stocker portion shown in FIG. 6.

FIG. 7 is a perspective view illustrating example shapes of the single-door-type stockers 104 in the open-type stocker portion 100 shown in FIG. 6. Referring to FIG. 7, the open-type stocker portion 100 may include, in addition to the single-door-type stockers 104 having the windows 102, the locking stoppers 106 and/or the safety sensor(s) 120.

The locking stoppers 106 may be on the single-door-type stockers 104 and/or may be located under the windows 102. The locking stoppers 106 may have handles that prevent the single-door-type stockers 104, that may be opened or closed using the handles, from being opened during the operation of the handler 1000. Accordingly, an accident involving an operator that may occur when an operator puts his or her hand into the single-door-type stockers 104 may be prevented.

The open-type stocker portion 100 may include one or more safety sensors 120 (two are depicted in FIG. 7). The one or more safety sensors 120 may be driven by light, so that when any of the single-door-type stockers 104 are opened, the one or more safety sensors 120 may optically sense the opened single-door-type stocker 104 and/or stop the operation of the handler 1000. Consequently, an abnormal operation of the handler 1000 may be prevented. The single-door-type stockers 104 may have structures that only receive user trays 101, not test trays 201.

Figure 8:
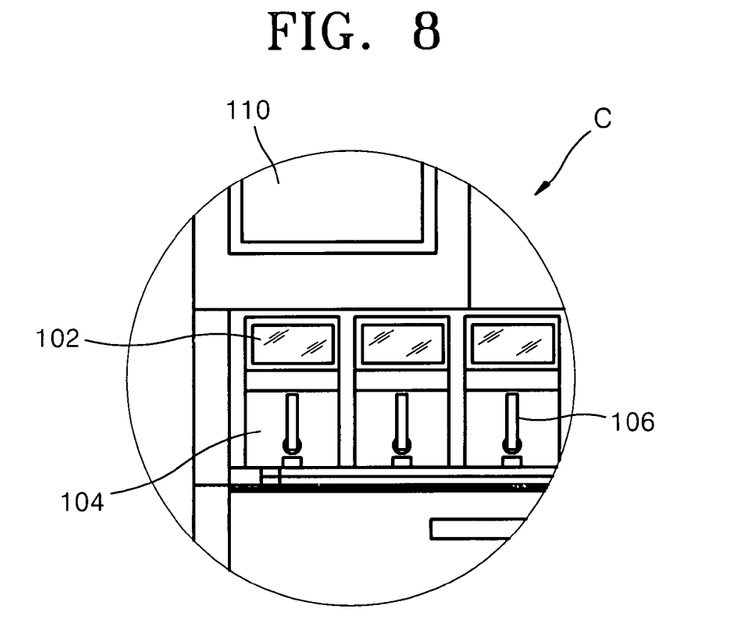
FIG. 8 is a magnified view of a portion C shown in FIG. 5.
Figure 9:
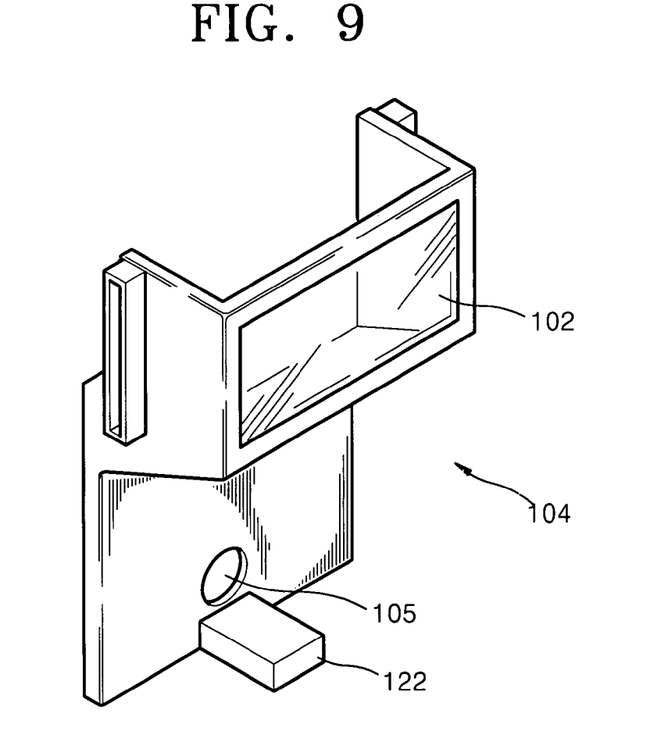
FIG. 9 is a perspective view of a front part of a single-door-type stocker shown in FIG. 7, from which a locking stopper is removed.

FIG. 8 is a magnified view of a portion C shown in FIG. 5. FIG. 9 is a perspective view of a front part of a single-door-type stocker 104 shown in FIG. 7, from which a locking stopper 106 is removed. Locking stopper 106 may fit, for example, in hole 105.

Referring to FIGS. 8 and 9, the single-door-type stockers 104 may be individual stockers that correspond to a stocker cover in a conventional handler. The single-door-type stockers 104 may be at least partially protected, for example, by one or more covers and may include the windows 102, through which an operator can check the inside of the single-door-type stockers 104. The windows 102 may be separately provided over the locking stoppers 106.

The windows 102 may be made, for example, of transparent or substantially transparent, durable material that is not easily damaged, such as polycarbonate, acrylic resin, polycarbonate and acrylic resin, and/or similar material(s). In FIG. 9, reference numeral 122 denotes a protection cover that may prevent foreign materials from entering the area where the locking stopper 106 operates.

As described above, the handler for performing electrical tests on semiconductor devices may include single-door-type stockers on which transparent or substantially transparent windows may be provided. Accordingly, an operator may easily check the number of user trays remaining within the single-door-type stockers without a need to open a heavy stocker cover. Also, when DUTs are injected into and/or ejected from the handler, the opening and closing of the heavy stocker cover does not occur, so that the working efficiency may be improved.

Also, frequent equipment breakdowns due to a frequent opening and closing operation of the stocker cover, for example, the instantaneous stoppage of the handler due to the bending of a stocker cover and/or the inability of the stocker door to be closed because of damage to the handle of the stocker door, may be prevented. Hence, degradation of the operation rate of a handler can be reduced.

Furthermore, due to the inclusion of locking stoppers and/or safety sensor(s) instead of the stocker cover, a safety accident in which the fingers of an operator are injured may be prevented.

While example embodiments have been particularly shown and described, it will be understood by those of ordinary skill in the art that various changes in form and details may be made therein without departing from the spirit and scope of the present invention as defined by the following claims.

What is claimed is:

1. A handler, comprising:
   a handler system main body;
   an open-type stocker portion on a front side of the handler system main body; and
   a plurality of single-door-type stockers in the open-type stocker portion;
   wherein the single-door-type stockers include windows on front sides of the single-door-type stockers, and
   wherein the front sides of the single-door-type stockers are at least partially protected.

2. The handler of claim 1, wherein the handler system main body is a parallel-type handler used for electrically testing memory devices.

3. The handler of claim 1, wherein the handler system main body comprises a front top door over the open-type stocker portion, and
   wherein the front top door exposes an area where semiconductor devices to be electrically tested are conveyed.

4. The handler of claim 1, wherein the handler system main body comprises a control panel on the front side of the handler system main body, and
   wherein the control panel controls the handler system main body.

5. The handler of claim 1, wherein at least one of the single-door-type stockers is loaded with one or more user trays.

6. The handler of claim 1, wherein the open-type stocker portion comprises a working table that protrudes outwardly.

7. The handler of claim 6, wherein the working table is detachable.

8. The handler of claim 6, wherein the working table protrudes outwardly greater than or equal to about 30 cm and less than or equal to about 50 cm.

9. The handler of claim 1, wherein the open-type stocker portion comprises one or more safety sensors, and
   wherein the one or more safety sensors stop the handler when the single-door-type stockers are not closed.

10. The handler of claim 9, wherein at least one of the one or more safety sensors is an optical sensor.

11. The handler of claim 9, wherein the open-type stocker portion comprises a safety sensor on a side of the open-type stocker portion, and
    wherein the safety sensor is an optical sensor.

12. The handler of claim 9, wherein the open-type stocker portion comprises safety sensors on both sides of the open-type stocker portion, and
    wherein the safety sensors are optical sensors.

13. The handler of claim 1, wherein the windows are made of transparent or substantially transparent material so that insides of the single-door-type stockers can be checked with a naked eye.

14. The handler of claim 1, wherein the single-door-type stockers further comprise locking stoppers below the windows.

15. The handler of claim 1, further comprising:
    a front top door on an upper part of the front side of the handler system main body;
    locking stoppers in the single-door-type stockers;
    safety sensors on both sides of the open-type stocker portion; and
    a working table in front of the open-type stocker portion;
    wherein the open-type stocker portion is below the front top door,
    wherein the safety sensors stop the handler when the single-door-type stockers are not closed, and
    wherein the working table protrudes from the handler system main body.

16. The handler of claim 15, wherein the handler system main body is a parallel-type handler used for electrically testing memory devices.

17. The handler of claim 15, wherein the handler system main body comprises a control panel on the front side of the handler system main body, and wherein the control panel controls the handler system main body.

18. The handler of claim 15, wherein at least one of the single-door-type stockers is loaded with one or more user trays.

19. The handler of claim 15, wherein the working table is detachable.

20. The handler of claim 15, wherein the safety sensors are driven by light.

21. The handler of claim 15, wherein the windows are made of transparent or substantially transparent material so that insides of the single-door-type stockers can be checked with a naked eye.

22. The handler of claim 21, wherein the transparent or substantially transparent material is polycarbonate, acrylic resin, or polycarbonate and acrylic resin.

23. The handler of claim 15, wherein the locking stoppers are below the windows of the single-door-type stockers.

\* \* \* \* \*